(12) United States Patent
Chen et al.

(10) Patent No.: US 10,886,245 B2
(45) Date of Patent: Jan. 5, 2021

(54) SEMICONDUCTOR STRUCTURE, 3DIC STRUCTURE AND METHOD OF FABRICATING THE SAME

(71) Applicant: Taiwan Semiconductor Manufacturing Co., Ltd., Hsinchu (TW)

(72) Inventors: Hsien-Wei Chen, Hsinchu (TW); Jie Chen, New Taipei (TW); Ming-Fa Chen, Taichung (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/425,951

(22) Filed: May 30, 2019

(65) Prior Publication Data

US 2020/0381379 A1    Dec. 3, 2020

(51) Int. Cl.
*H01L 23/00*    (2006.01)
*H01L 25/065*    (2006.01)
(Continued)

(52) U.S. Cl.
CPC .............. *H01L 24/05* (2013.01); *H01L 22/14* (2013.01); *H01L 22/32* (2013.01); *H01L 23/528* (2013.01);
(Continued)

(58) Field of Classification Search
CPC ....... H01L 24/05; H01L 23/544; H01L 24/83; H01L 24/06; H01L 23/528; H01L 22/14; H01L 24/27; H01L 24/32; H01L 22/32; H01L 25/0657; H01L 25/50; H01L 24/03; H01L 2224/0392; H01L 2224/03614; H01L 2224/0362; H01L 2224/83895; H01L 2224/06515; H01L 2224/05568; H01L 2224/80896; H01L 2224/32148; H01L 2224/83896; H01L 2225/06593;
(Continued)

(56) References Cited

U.S. PATENT DOCUMENTS 8,802,504 B1 *  8/2014  Hou ................... H01L 23/5226
                                                            438/125
8,993,380 B2    3/2015  Hou et al.
(Continued)

FOREIGN PATENT DOCUMENTS

TW          201919175          5/2019

OTHER PUBLICATIONS

"Office Action of Taiwan Counterpart Application", dated Oct. 22, 2020, p. 1-p. 5.

*Primary Examiner* — Su C Kim
(74) *Attorney, Agent, or Firm* — JCIPRNET

(57) ABSTRACT

Provided is a three-dimensional integrated circuit (3DIC) structure including a first die and a second die bonded together by a hybrid bonding structure. One of the first die and the second die has a pad and a cap layer disposed over the pad. The cap layer exposes a portion of a top surface of the pad, and the portion of the top surface of the pad has a probe mark. A bonding metal layer of the hybrid bonding structure penetrates the cap layer to electrically connect to the pad. A method of fabricating the first die or the second die of 3DIC structure is also provided.

20 Claims, 16 Drawing Sheets

(51) Int. Cl.
*H01L 21/66* (2006.01)
*H01L 25/00* (2006.01)
*H01L 23/528* (2006.01)
*H01L 23/544* (2006.01)
*H01L 25/18* (2006.01)

(52) U.S. Cl.
CPC ............ *H01L 23/544* (2013.01); *H01L 24/03* (2013.01); *H01L 24/06* (2013.01); *H01L 24/27* (2013.01); *H01L 24/32* (2013.01); *H01L 24/83* (2013.01); *H01L 25/0657* (2013.01); *H01L 25/50* (2013.01); *H01L 25/18* (2013.01); *H01L 2223/54426* (2013.01); *H01L 2224/0362* (2013.01); *H01L 2224/0391* (2013.01); *H01L 2224/0392* (2013.01); *H01L 2224/03614* (2013.01); *H01L 2224/03622* (2013.01); *H01L 2224/05025* (2013.01); *H01L 2224/0557* (2013.01); *H01L 2224/05568* (2013.01); *H01L 2224/06515* (2013.01); *H01L 2224/08148* (2013.01); *H01L 2224/32148* (2013.01); *H01L 2224/80895* (2013.01); *H01L 2224/80896* (2013.01); *H01L 2224/83895* (2013.01); *H01L 2224/83896* (2013.01); *H01L 2225/06544* (2013.01); *H01L 2225/06565* (2013.01); *H01L 2225/06593* (2013.01)

(58) Field of Classification Search
CPC ............. H01L 25/18; H01L 2224/0557; H01L 2225/06544; H01L 2224/08148; H01L 2224/80895; H01L 2224/05025; H01L 2224/03622; H01L 2223/54426; H01L 2224/0391; H01L 2225/06565
See application file for complete search history.

(56) References Cited

U.S. PATENT DOCUMENTS

| | | | |
|---|---|---|---|
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2010/0044859 | A1 | 2/2010 | Yamaguchi et al. |
| 2015/0262989 | A1* | 9/2015 | Kawasaki ............... H01L 24/19 257/737 |
| 2017/0053844 | A1 | 2/2017 | Tsai et al. |
| 2017/0250160 | A1 | 8/2017 | Wu et al. |
| 2017/0271248 | A1* | 9/2017 | Chen ................... H01L 25/0657 |
| 2017/0345780 | A1* | 11/2017 | Bashyam .......... H01L 21/02074 |

* cited by examiner

SEMICONDUCTOR STRUCTURE, 3DIC STRUCTURE AND METHOD OF FABRICATING THE SAME

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Some types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
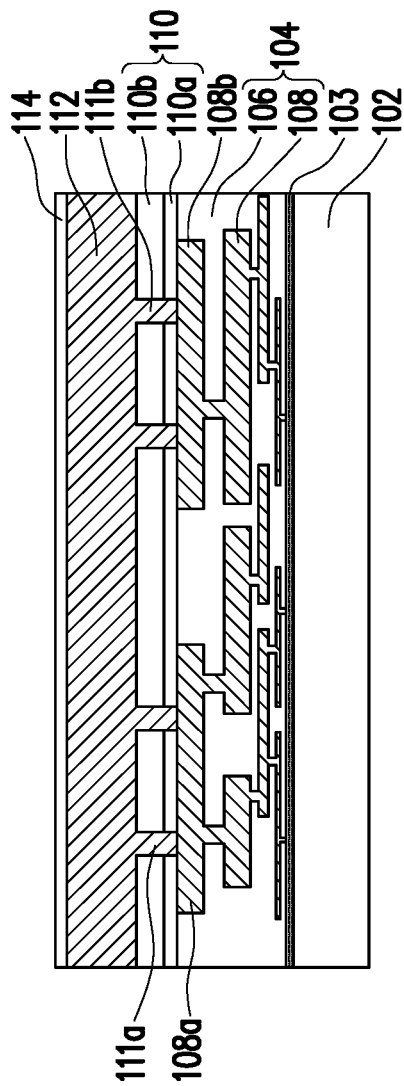
FIG. 1A to FIG. 1G are cross-sectional views of a method of forming a three-dimensional integrated circuit (3DIC) structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are cross-sectional views of a method of forming a three-dimensional integrated circuit (3DIC) structure in accordance with a first embodiment. FIG. 2 is a top view showing a structure of FIG. 1D.

Figure 1B:
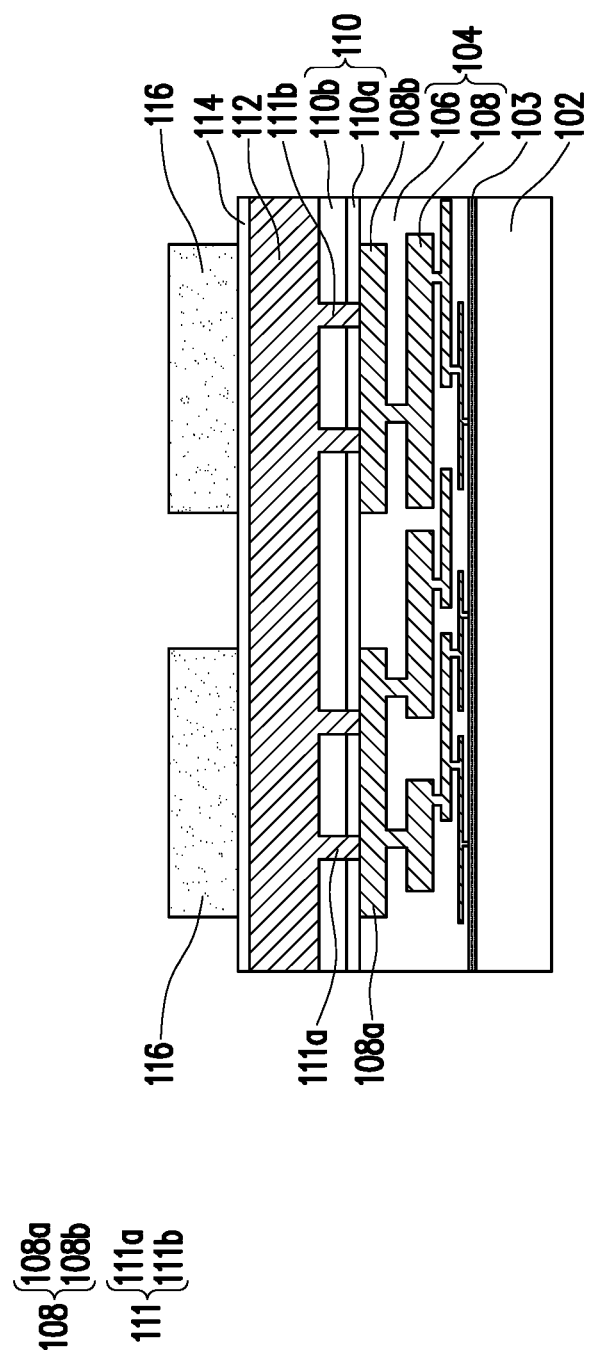
Figure 1C:
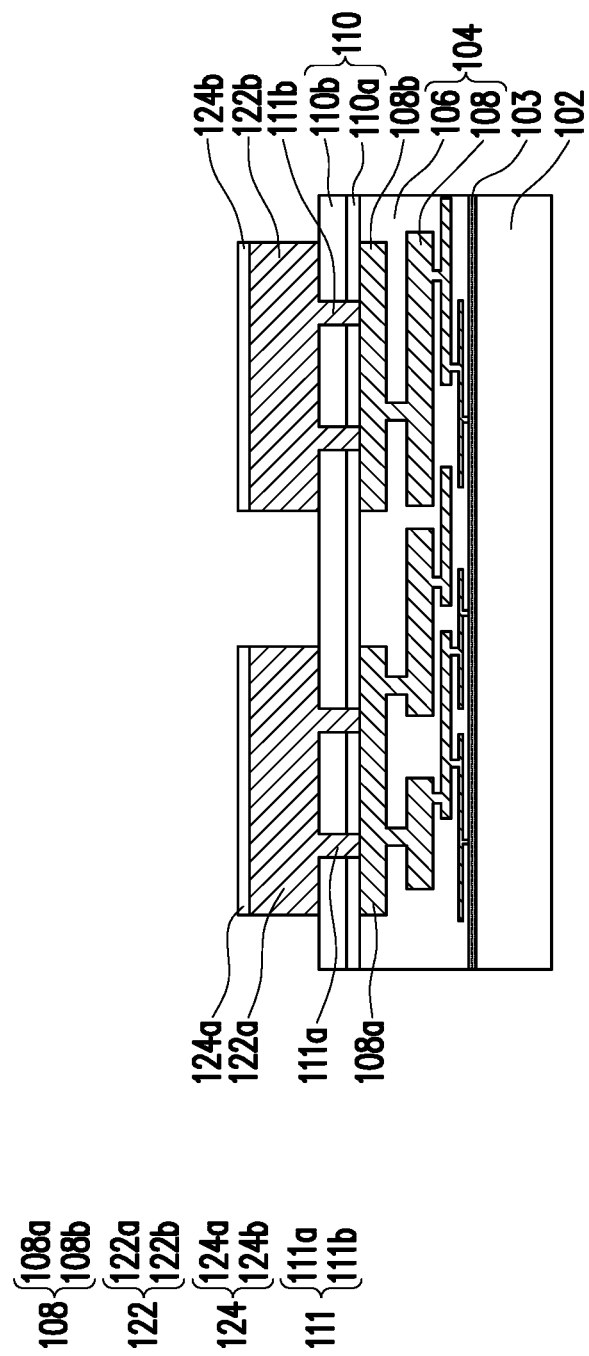
Figure 1D:
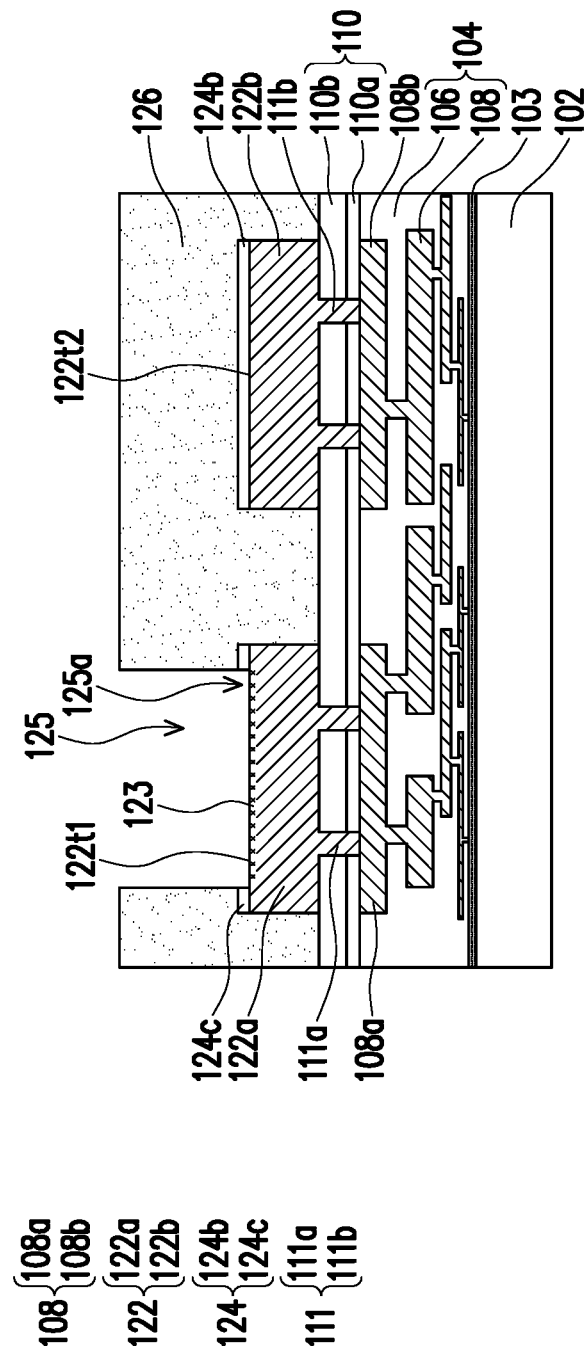
Figure 1E:
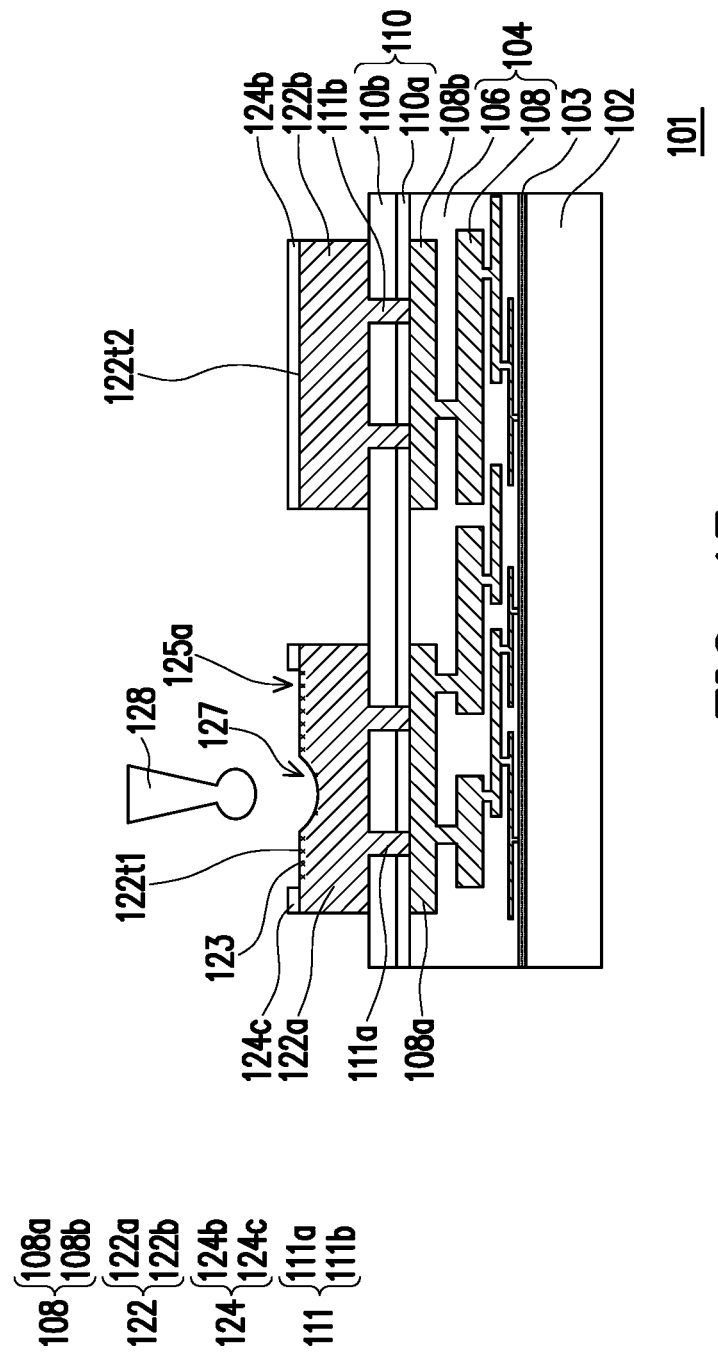
Figure 1F:
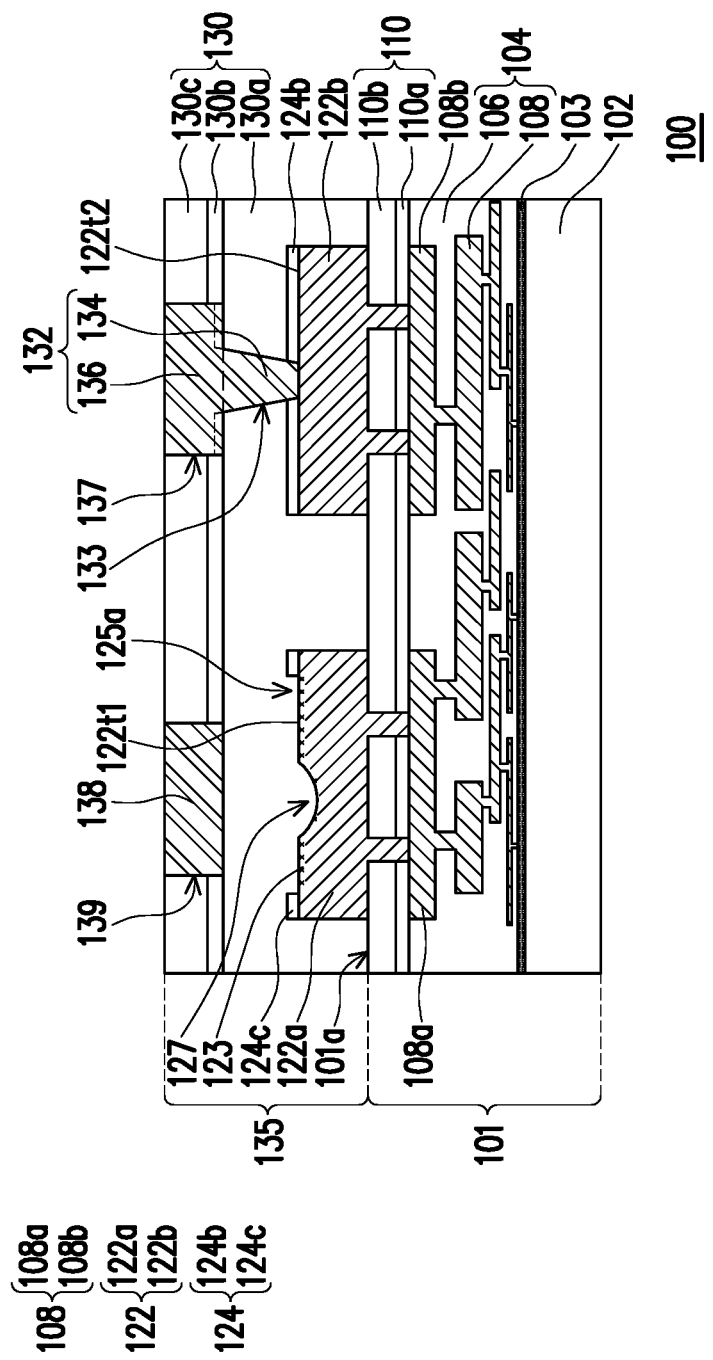
Figure 1G:
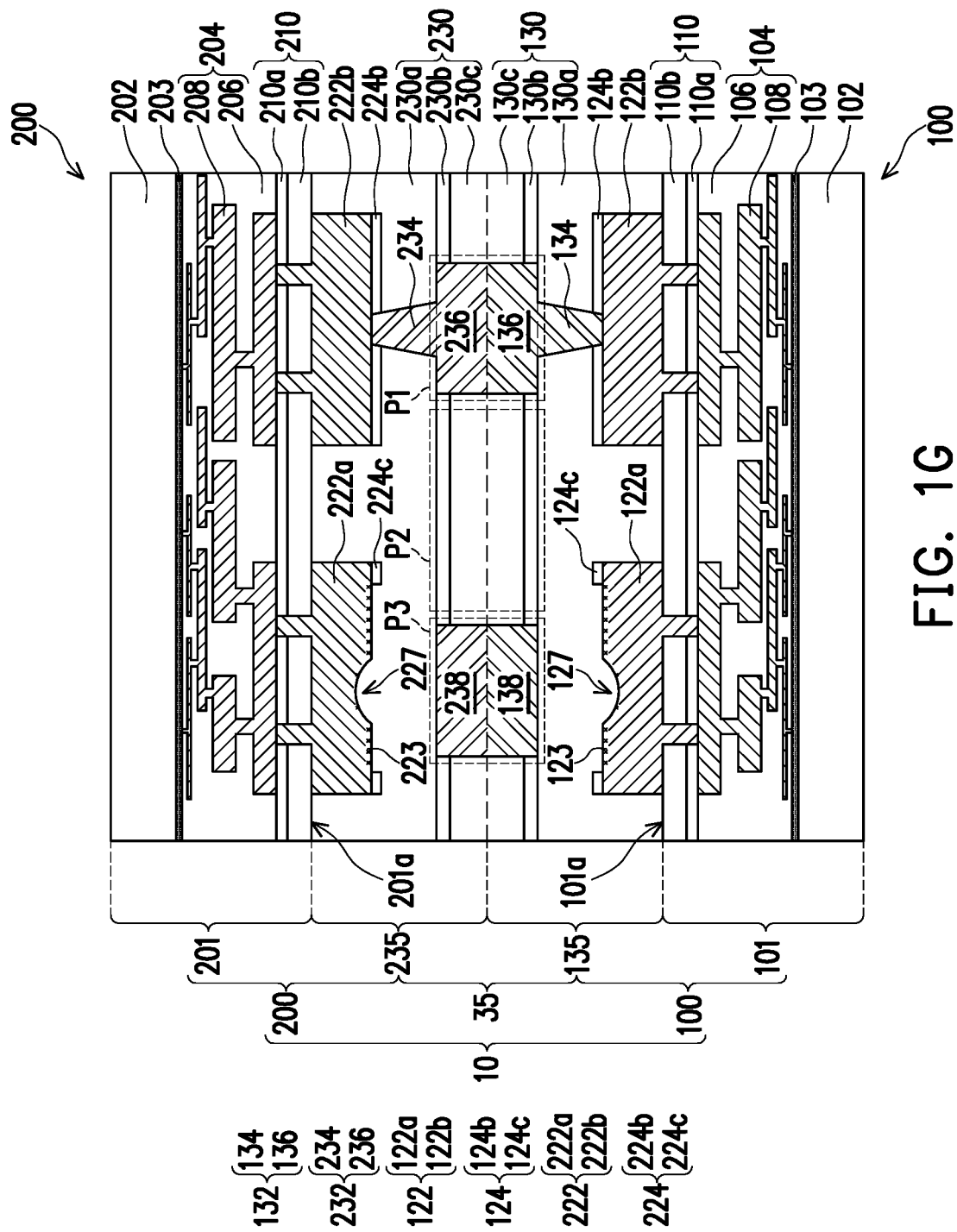

Referring to FIG. 1A, a method of forming a 3DIC structure 10 (as shown in FIG. 1G) includes following steps. First, an initial structure illustrated in FIG. 1A is provided. The initial structure includes a first semiconductor substrate 102, a first device layer 103, a first interconnect structure 104, a first passivation layer 110, a conductive material 112, and a cap material 114.

In some embodiments, the first semiconductor substrate 102 may include silicon or other semiconductor materials. Alternatively, or additionally, the first semiconductor substrate 102 may include other elementary semiconductor materials such as germanium. In some embodiments, the first semiconductor substrate 102 is made of a compound semiconductor such as silicon carbide, gallium arsenic, indium arsenide or indium phosphide. In some embodiments, the first semiconductor substrate 102 is made of an alloy semiconductor such as silicon germanium, silicon germanium carbide, gallium arsenic phosphide, or gallium indium phosphide. In some embodiments, the first semiconductor substrate 102 includes an epitaxial layer. For example, the first semiconductor substrate 102 has an epitaxial layer overlying a bulk semiconductor.

In some embodiments, the first device layer 103 is formed over the first semiconductor substrate 102 in a front-end-of-line (FEOL) process. The first device layer 103 includes a wide variety of devices. In some embodiments, the devices comprise active components, passive components, or a combination thereof. In some embodiments, the devices may include integrated circuits devices. The devices are, for example, transistors, capacitors, resistors, diodes, photo-diodes, fuse devices, or other similar devices. In some embodiments, the first device layer 103 includes a gate structure, source and drain regions, and isolation structures, such as shallow opening isolation (STI) structures (not shown). In the first device layer 103, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the first semiconductor substrate 102. The functions of the devices may include memory, processors, sensors, amplifiers, power distribution, input and/or output circuitry, or the like.

Referring to FIG. 1A, the first interconnect structure 104 is formed over the first device layer 103. In detail, the first interconnect structure 104 includes a first insulating material 106 and a plurality of first metal features 108. The first metal features 108 are formed in the first insulating material 106 and electrically connected to the first device layer 103. A portion of the first metal features 108, such as top metal features 108a and 108b, is exposed by the first insulating material 106. In some embodiments, the first insulating material 106 includes an inner-layer dielectric (ILD) layer on the first device layer 103, and at least one inter-metal dielectric (IMD) layer over the ILD layer. In some embodiments, the first insulating material 106 includes silicon oxide, silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In some alternatively embodiments, the first insulating material 106 may be a single layer or multiple layers. In some embodiments, the first metal features 108 include plugs and metal lines. The plugs may include contacts formed in the ILD layer, and vias formed in the IMD layer. The contacts are formed between and in connect with the first device layer 103 and a bottom metal line. The vias are formed between and in connect with two metal lines. The first metal features 108 may be made of tungsten (W), copper (Cu), copper alloys, aluminum (Al), aluminum alloys, or a combination thereof. In some alternatively embodiments, a barrier layer (not shown) may be formed between the first metal features 108 and the first insulating material 106 to prevent the material of the first metal features 108 from migrating to or diffusion to the first device layer 103. A material of the barrier layer includes tantalum, tantalum nitride, titanium, titanium nitride, cobalt-tungsten (CoW) or a combination thereof, for example.

Referring to FIG. 1A, the first passivation layer 110 is formed over the first interconnect structure 104. In some embodiments, the first passivation layer 110 includes silicon oxide, silicon nitride, benzocyclobutene (BCB) polymer, polyimide (PI), polybenzoxazole (PBO) or a combination thereof and is formed by a suitable process such as spin coating, CVD or the like. In an embodiment, the first passivation layer 110 may be a single layer structure, a bilayer structure, or a multilayer structure. As shown in FIG. 1A, the first passivation layer 110 includes a passivation material 110a and a passivation material 110b formed over the passivation material 110b. The passivation materials 110a and 110b have different materials. For example, the passivation material 110a may include silicon nitride, while the passivation material 110b may include polyimide (PI) or any material different from silicon nitride.

Referring to FIG. 1A, the conductive material 112 is formed over the first passivation layer 110 and electrically connected to the top metal features 108a and 108b by plugs 111 which penetrate through the first passivation layer 110. The conductive material 112 and the first metal features 108 may have different materials. In some embodiments, the conductive material 112 is softer than the first metal features 108. The conductive material 112 and the plugs 111 may have a same material. In some embodiments, the conductive material 112 and the plugs 111 respectively include a metal material, such as aluminum, copper, nickel, gold, silver, tungsten, or a combination thereof, which may be formed by patterning the first passivation layer 110 to form a plurality openings to reach the first metal features 108, depositing a metal material layer to fill in the openings and cover the first passivation layer 110 through a suitable process such as electro-chemical plating process, CVD, atomic layer deposition (ALD), PVD or the like, and then patterning the metal material layer.

Referring to FIG. 1A, the cap material 114 is formed over the conductive material 112. The cap material 114 may be a dielectric material, for example. In some embodiments, the cap material 114 includes a nitrogen-containing material, such as silicon oxynitride, silicon nitride or a combination thereof, and has a thickness of 50 nm to 100 nm. In another embodiment, the cap material 114 is referred to as an anti-reflective coating (ARC) layer, which may include an organic ARC material (e.g., polymer resin), an inorganic ARC material (e.g., SiON), or a combination thereof. In some alternatively embodiments, the cap material 114 may be a single layer or multiple layers and may be formed by a suitable process such as CVD, ALD, or the like.

Referring to FIG. 1B, a mask pattern 116 is formed over the cap material 114. In some embodiments, the mask pattern 116 may correspond to the top metal features 108a and 108b in order to form a pad 122 subsequently (as shown in FIG. 1C). In one embodiment, the mask pattern 116 includes photoresist and is formed by a suitable process, such as a spin coating and a photolithography process.

Referring to FIG. 1B and FIG. 1C, after the mask pattern 116 is formed, a first etching process is performed by using the mask pattern 116 as an etching mask to remove portions of the cap material 114 and the conductive material 112, so as to expose the passivation material 110b. In some embodiments, the first etching process may include a dry etching process, a wet etching process, or a combination thereof. In the case, as shown in FIG. 1C, a plurality of pads 122 (also referred to as conductive pads) and a plurality of cap layers 124 (also referred to as dielectric pads) respectively disposed over the pads 122 are formed. In the embodiments, the pads 122 includes a first pad 122a and a second pad 122b separating from each other. The first pad 122a is electrically connected to the top metal feature 108a by the first plugs 111a. In some embodiments, the first pad 122a may be aligned with or partially overlapped with the top metal feature 108a. The second pad 122b is electrically connected to the top metal feature 108b by the second plugs 111b. In some embodiments, the second pad 122b may be aligned with or partially overlapped with the top metal feature 108b. A first cap layer 124a is disposed over the first pad 122a, and a second cap layer 124b is disposed over the second pad 122b. Although only two pads 122 and two cap layers 124 are illustrated in FIG. 1C, the embodiments of the present disclosure are not limited thereto. In other embodiments, the number of the pads 122 and the cap layers 124 may be adjusted by the need. After the pads 122 and the cap layers 124 are formed, the mask pattern 116 is removed.

Referring to FIG. 1C and FIG. 1D, a mask pattern 126 is formed over the pad 122. The mask pattern 126 covers the passivation material 110b, the second cap layer 124b and the second pad 122b, and has an opening 125 exposing a portion of the first cap layer 124a. The shape of the opening 125 may be a regular shape or an irregular shape. The shape of the opening 125 is, for example, a square, a rectangle, a circle, an ellipse, or the like, but is not limited thereto. In one embodiment, the mask pattern 126 includes photoresist and is formed by a suitable process, such as a spin coating and a photolithography process.

After the mask pattern 126 is formed, a second etching process is performed by using the mask pattern 126 as an etching mask to remove the portion of the first cap layer 124a, so as to expose the first pad 122a. In one embodiment, the second etching process may include an isotropic etching process. In another embodiment, the second etching process may include a wet etching process or a combination of a wet etching process and a dry etching process. The wet etching process may be performed by using an etching solution which includes halogen, such as F, Cl, Br, or a combination thereof. For example, the etching solution may include a HF solution, a HCl solution, a HBr solution, or a combination thereof. The dry etching process may be performed by using an etching gas which includes halogen, such as F, Cl, Br, or a combination thereof. In the case, as shown in FIG. 1D, a top surface or top portion 122t1 of the first pad 122a exposed by a remaining portion of the first cap layer 124c (hereinafter, referred to the first cap layer 124c) may be (e.g., chemically) modified or damaged, so that a resistance value of the top portion 122t1 of the first pad 122a is less than a resistance value of other portion of the first pad 122a.

In alternative embodiments, some residues 123 may be formed in or on the first cap layer 124c. Herein, the residues 123 may be a chemical residue during the second etching process. Accordingly, the residues 123 may be from the first cap layer 124a and the first pad 122a which may have the nitrogen-containing material, such as silicon oxynitride, silicon nitride or a combination thereof, and the metal material, such as aluminum, copper, nickel, gold, silver, tungsten, or a combination thereof. In some alternative embodiments, a resistance value of the second pad 122b with the residues 123 are greater than a resistance value of the first pad 122a. In an embodiment, the residues 123 may blanketly or continuously cover the first pad 122a. Alternatively, the residues 123 may partially or non-continuously cover the first pad 122a. In other embodiments, the charge accumulation may occur on the top surface or top portion 122t1 of the first pad 122a, which may affect the resistance value of the top portion 122t1 of the first pad 122a.

Figure 2A:
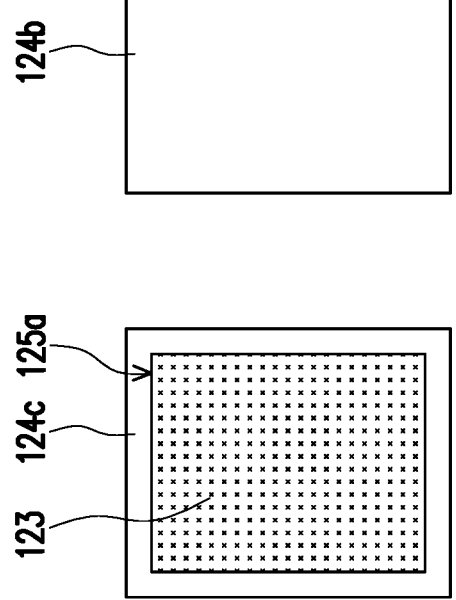
FIG. 2A and FIG. 2B are top views respectively showing structures of FIG. 1D and FIG. 1F.

As shown in FIG. 1D and the top view of FIG. 2A, the first cap layer 124c and the second cap layer 124b are configured to have different shapes. In some embodiments, the first cap layer 124c is configured as a ring structure to surround the portion of the first pad 122a or the residues 123, while the second cap layer 124b is configured as a block structure that covers the second pad 122b. The ring may be a circular ring, a rectangular ring, an elliptical ring, and the ring may have a uniform width. However, in some embodiments, because of the misalignment during the lithography process for the mask pattern 126, the ring may have different widths or become a ring with a gap. In some embodiments, the first pad 122a not covered by the first cap layer 124c has the residues 123 thereon or therein, while the second pad 122b is free of the residues 123. In the case, a top portion 122t2 of the second pad 122b has a lower resistance than the top portion 122t1 of the first pad 122a, in one embodiment.

Further, the opening 125 of the mask pattern 126 extends into the first cap layer 124c, so that the first cap layer 124c has an opening 125a, as show in FIG. 1D. In the case, the shape of the first pad 122a exposed by the opening 125a of the first cap layer 124c may be have an irregular shape or a regular shape, for example, a square shape, a rectangle shape, a circle shape, an ellipse shape, or the like, but is not limited thereto.

Referring to FIG. 1D and FIG. 1E, after the mask pattern 126 is removed, a circuit probing (CP) test is performed on the first pad 122a. Specifically, a probe 128 may be used to electrically couple to the first pad 122a for wafer or die testing to check whether the die is a good die. In some embodiments, the CP test is also referred to as wafer acceptance testing (WAT). In some embodiments, the first pad 122a is used for electrical testing to check whether a first die 101 illustrated in FIG. 1E is a good die, but the disclosure is not limited thereto. The first die 101 may be selected to test different properties of the wafer or the die, such as leakage current, breakdown voltage, threshold voltage and effective channel length, saturation current, contact resistance and connections. It should be noted that the first die 101 is selected to proceed the following process when the first die 101 is identified as a known good die (KGD). In the case, as shown in FIG. 1E, a probe mark 127 is formed at the top portion 122t1 of the first pad 122a, and the probe mark 127 may be a recess concaving or recessing into the first pad 122a. Since the probe 128 may press or squeeze the residues 123 to electrically connect to the first pad 122a during the CP test, the residues 123 underlying the probe mark 127 may be squeezed to two side of the probe mark 127 after the CP test, as shown in FIG. 1E. That is, the top portion 122t underlying the probe mark 127 may have a lower resistance than the top portion 122t aside the probe mark 127.

Referring to FIG. 1E to FIG. 1F, a first bonding structure 135 is formed over a front side 101a of the first die 101. Herein, the so-called front side 101a refers to a top surface of the first passivation layer 110. In detail, as shown in FIG. 1F, after the first die 101 is identified as the known good die, a bonding dielectric material 130a (or referred as a first bonding dielectric material) is disposed over the front side 101a of the first die 101. In some embodiments, as shown in FIG. 1F, the bonding dielectric material 130a covers the first pad 122a, the residues 123, the first cap layer 124c, the second pad 122b, the second cap layer 124b, and the passivation material 110b. In some embodiments, the bonding dielectric material 130a includes silicon oxide, silicon nitride, polymer or a combination thereof. The bonding dielectric material 130a is formed by a suitable process such as spin coating, CVD or the like.

In FIG. 1F, a first blocking layer 130b is then formed to cover the bonding dielectric material 130a. In some embodiments, the first blocking layer 130b includes a dielectric material, such as silicon oxide, silicon nitride, silicon oxynitride, or a combination thereof, and is formed by a suitable process such as CVD, ALD, or the like. In some embodiments, a thickness of the first blocking layer 130b is 50 μm to 100 μm.

In FIG. 1F, another bonding dielectric material 130c (or referred as a second bonding dielectric material) is formed over the first blocking layer 130b. That is, the first blocking layer 130b is disposed between the bonding dielectric materials 130a and 130c. In some embodiments, a material of the first blocking layer 130b is different from that of the bonding dielectric material 130a and 130c. For example, the first blocking layer 130b may include silicon nitride, while the bonding dielectric materials 130a and 130c may include silicon oxide. However, the embodiments of the present disclosure are not limited thereto. In other embodiments, the bonding dielectric material 130a and 130c and the first blocking layer 130b have different materials. In some embodiments, the bonding dielectric material 130c includes silicon oxide, silicon nitride, polymer or a combination thereof. The bonding dielectric material 130c is formed by a suitable process such as spin coating, CVD or the like. Thereafter, a planarization process may be performed on the bonding dielectric material 130c, so that a top surface of the bonding dielectric material 130c has a flat surface, in some embodiments. In alternative embodiments, the planarization process includes a CMP process, an etching back process, or a combination thereof.

After a first bonding dielectric layer 130 which includes the bonding dielectric materials 130a and 130c and the first blocking layer 130b between the bonding dielectric materials 130a and 130c is formed, a first bonding metal layer 132 is formed in the first bonding dielectric layer 130 and a first dummy metal feature 138 are optionally formed in the first bonding dielectric layer 130, thereby accomplishing a first semiconductor structure 100, as shown in FIG. 1F. In some embodiments, the first semiconductor structure 100 may include a semiconductor die, a semiconductor chip, a semiconductor wafer, or a combination thereof. In the embodiment, the first semiconductor structure 100 includes the first die 101 and the first bonding structure 135 over the front side 101a of the first die 101. The first die 101 may be an application-specific integrated circuit (ASIC) chip, an analog chip, a sensor chip, a wireless and radio frequency chip, a voltage regulator chip or a memory chips, for example.

In FIG. 1F, the first bonding metal layer 132 corresponds to and is electrically connected to the second pad 122b. In some embodiments, the first bonding metal layer 132 includes a via plug 134 and a metal feature 136. The metal feature 136 is a via plug having a larger area than the via plug 134, for example. As shown in FIG. 1F, the via plug 134 penetrates through the bonding dielectric material 130a and the second cap layer 124b to contact the second pad 122b. The metal feature 136 penetrates through the bonding dielectric material 130c and the first blocking layer 130b to connect to the via plug 134. In other words, the metal feature 136 is electrically connected to the second pad 122b through the via plug 134. The first bonding metal layer 132 is electrically connected to the top metal feature 108b through the second pad 122b. In some embodiments, the first bonding metal layer 132 is formed by a dual damascene method.

On the other hand, the first dummy metal feature 138 is optionally formed aside the first bonding metal layer 132 and corresponding to the first pad 122a. The first dummy metal feature 138 is disposed in the bonding dielectric material 130c and the first blocking layer 130b and exposed by the bonding dielectric material 130c. Herein, when elements are described as "dummy", the elements are electrically floating or electrically isolated from other elements. For example, as shown in FIG. 1F, the first dummy metal feature 138 is electrically floating. In some embodiments, the first dummy metal feature 138 is formed by a single damascene method.

In some embodiment, the first dummy metal feature 138 and the metal feature 136 (or the first bonding metal layer 132) are at substantially the same level. That is, tops of the first dummy metal feature 138 and the metal feature 136 (or the first bonding metal layer 132) are substantially coplanar with the top surface of the bonding dielectric material 130c.

In some embodiments, the first dummy metal feature 138 may include copper, copper alloys, nickel, aluminum, tungsten, a combination of thereof. The first bonding metal layer 132 may include copper, copper alloys, nickel, aluminum, tungsten, a combination of thereof. In some embodiments, the material of the first dummy metal feature 138 and the material of the first bonding metal layer 132 may be the same. In some alternatively embodiments, the material of the first dummy metal feature 138 may be different from the material of the first bonding metal layer 132.

In some embodiments, the first dummy metal feature 138 and the metal feature 136 are formed at the same time. In some other embodiments, the first dummy metal feature 138 and the metal feature 136 are successively formed. The first dummy metal feature 138 and the first bonding metal layer 132 are formed by a trench first process, a via hole first process, a trench first process or a self-aligned process.

In some embodiments, the first dummy metal feature 138 and the first bonding metal layer 132 are formed as following steps (referred as the trench first process). The bonding dielectric material 130c and the blocking layer 130b are patterned by lithography and etching processes to form trenches 137 and 139 therein. The trench 139 corresponds to the first pad 122a and the trench 137 corresponds to the second pad 122b. During the etching process, the first blocking layer 130b serves as an etching stop layer, and thus the first blocking layer 130b is exposed or penetrated by the trenches 137 and 139. Next, portions of the bonding dielectric material 130a and the second cap layer 124b are patterned by another lithography and etching processes to form a via hole 133 therein. In one embodiment, the etching process may include an anisotropic etching process. In another embodiment, the etching process may include a dry etching process. The dry etching process may be performed by using an etching gas which includes $O_2$, $N_2$, $CH_4$, or a combination thereof. In the case, the dry etching process is able to prevent the top surface or the top portion 122t2 of the second pad 122b from chemical modification or damage. The via hole 133 may expose the second pad 122b. Thereafter, a conductive material layer and a barrier material layer (not shown) are formed on the bonding dielectric layer 130c, and fills into the trenches 137 and 139, and the via hole 133. The conductive material layer on the bonding dielectric material 130c is then removed by a planarization process such as a CMP process, and thus the first dummy metal feature 138 is formed in the trench 139, and the via plug 134 and the metal feature 136 are formed in the via hole 133 and the trench 137 respectively. In some alternative embodiments, one of the trenches 137 and 139 may be referred to as a greater via hole than the via hole 133.

In some other embodiments, the first dummy metal feature 138 and the first bonding metal layer 132 are formed as following steps (referred as a via hole first process). The bonding dielectric materials 130a and 130c, the first blocking layer 130b and the second cap layer 124b are patterned by lithography and etching processes to form via hole 133. In one embodiment, the etching process may include an anisotropic etching process. In another embodiment, the etching process may include a dry etching process. The dry etching process may be performed by using an etching gas which includes $O_2$, $N_2$, $CH_4$, or a combination thereof. Next, the bonding dielectric material 130c and the first blocking layer 130b are patterned by lithography and etching processes to form trenches 137 and 139 therein. During the etching process, the first blocking layer 130b is serves as an etching stop layer, and thus the first blocking layer 130b is exposed or penetrated by the trenches 137 and 139. Thereafter, the conductive material layer is formed and the planarization process is performed.

In alternative embodiments, the first dummy metal feature 138 and the first bonding metal layer 132 are formed as following steps (referred as the self-aligned process). After the bonding dielectric material 130a is formed, the first blocking layer 130b is formed and patterned by lithography and etching processes to form via hole patterns therein. Next, the bonding dielectric material 130c is formed over the first blocking layer 130b with the via hole patterns. The bonding dielectric material 130c fills into the via hole patterns of the first blocking layer 130b and is in contact with the bonding dielectric material 130a. Thereafter, a patterned mask with trench patterns is formed on the bonding dielectric material 130c by a lithography process, some of the trench patterns are corresponding to the via hole patterns of the first blocking layer 130b. Thereafter, an etching process is performed on the bonding dielectric material 130c by using the first blocking layer 130b as an etching stop layer, so that the trench 137 and 139 are formed. In one embodiment, the etching process may include an anisotropic etching process. In another embodiment, the etching process may include a dry etching process. The dry etching process may be performed by using an etching gas which includes $O_2$, $N_2$, $CH_4$, or a combination thereof. At the same time, the bonding dielectric material 130a is etched by using the first blocking layer 130b with the via hole patterns as a hard mask, so that via hole 133 is formed in the bonding dielectric material 130a and self-aligned with the trench 137. Thereafter, the conductive material layer is formed and the planarization process is performed.

In FIG. 1F, the first blocking layer 130b has the same pattern as the bonding dielectric material 130c and both have trenches 137 and 139. However, depending on the process, the first blocking layer 130b may have the same pattern as the bonding dielectric material 130a and both have the via hole 133 as indicated by the dashed lines. In other word, a bottom of the trench 137 over the second pad 122b exposes a portion of the first blocking layer 130b, and the first blocking layer 130b under the bottom of the trench 137 has a pattern of the via 133. A bottom of the trench 139 over the first pad 122a exposes a portion of the first blocking layer 130b, and the first blocking layer 130b under the bottom of the trench 139 does not have a pattern of via.

As shown in FIG. 1F, the first pad 122a is electrically isolated from the first bonding metal layer 132 and the dummy metal feature 120 by the bonding dielectric material 130a. In one embodiment, the first pad 122a may be referred to as a test pad. In addition, the second pad 122b is electrically connected to the first bonding metal layer 132. In another embodiment, the second pad 122b may be referred to as a connect pad which transfers the signal from the first die 101 to an overlying second die 201 (as shown in FIG. 1G). It should be noted that, in some embodiments, the second cap layer 124b is able to protect the second pad 122b from forming the residues during the foregoing etching process, thereby maintain the contact resistance between the second pad 122b and the first bonding metal layer 132. In the case, the contact resistances between the second pads 122b and the first bonding metal layers 132 distributed in the entire first semiconductor structure 100 (or the entire semiconductor wafer) have a better uniformity, thereby enhancing the yield of the first semiconductor structure 100 (or a to-be-formed 3DIC structure 10 illustrated in FIG. 1G). In some alternative embodiments, the second pad 122b is electrically isolated from the dummy metal feature 120 by the bonding dielectric material 130a.

Figure 2B:
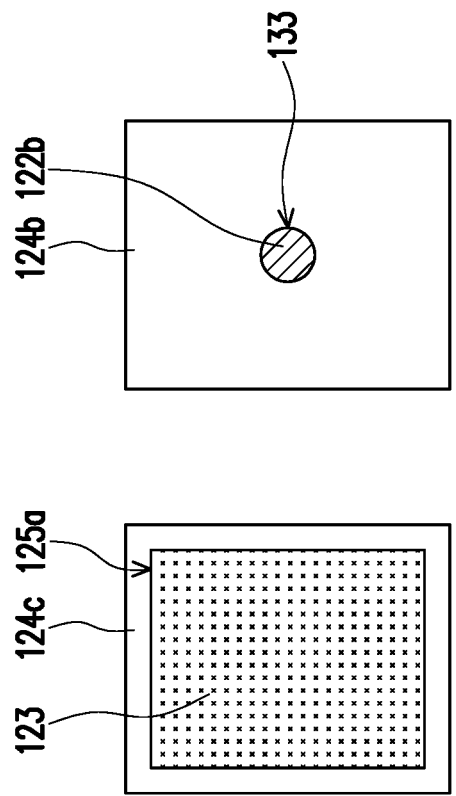

As shown in FIG. 1F and FIG. 2B, after the via hole 133 is formed, a top view of the first cap layer 124c and the second cap layer 124b are shown in FIG. 2B. The first cap layer 124c and the second cap layer 124b are configured to have ring shapes. In some embodiments, the first cap layer 124c is configured as one ring structure to surround the portion of the first pad 122a or the residues 123, while the second cap layer 124b is configured as another ring structure to surround a portion of the second pad 122b. In some embodiments, the first pad 122a has the residues 123 thereon, while the second pad 122b is free of the residues thereon. Therefore, the via 134 may contact the second pad 122b free of the residue 123. In some embodiments, an area of the residues 123 exposed by the first cap layer 124c is greater than an area of the second pad 122b exposed by the second cap layer 124b.

Referring to FIG. 1G, a second semiconductor structure 200 is provided. In detail, the second semiconductor structure 200 includes a second die 201 and a second bonding structure 235 disposed over a front side 201a of the second die 201. In some embodiments, the second semiconductor structure 200 may include a semiconductor die, a semiconductor chip, a semiconductor wafer, or a combination thereof. The second die 201 may be an application-specific integrated circuit (ASIC) chip, an analog chip, a sensor chip, a wireless and radio frequency chip, a voltage regulator chip or a memory chips, for example. The second die 201 and the first die 101 may be the same type of dies or different types of dies.

In some embodiments, the second die 201 is similar to the first die 101. That is, the second die 201 includes a second semiconductor substrate 202, a second device region 203, a second interconnect structure 204, a second passivation layer 210 (including passivation materials 210a and 210b), a pad 222, and a cap layer 224. The arrangement, material and forming method of the second die 201 are similar to the arrangement, material and forming method of the first die 101. Thus, details thereof are omitted here. The first die 101 and the second die 201 illustrated in FIG. 1G have the same size. Herein, the term "size" is referred to the length, width, or area. For example, as shown in FIG. 1G, the length of the second die 201 is equal to the length of the first die 101. However, the embodiments of the present disclosure are not limited thereto. In other embodiments, the size of the first die 101 is different from the size of the second die 201. For example, the first die 101 may be a wafer, the second die 201 may be a die and disposed over the wafer as a chip-on-wafer (CoW) structure.

In some embodiments, the second bonding structure 235 includes a second bonding dielectric layer 230, a second bonding metal layer 232, and a second dummy metal feature 238. The second dummy metal feature 238 corresponds to a first pad 222a, while the second metal layer 232 corresponds to a second pad 222b. The first cap layer 224c may be configured as a ring structure to surround the portion of the first pad 222a or the residues 223, while the second cap layer 224b may be configured as a block structure that covers the second pad 222b. The portion of the first pad 222a has a probe mark 227 concaving or recessing into a top surface of the first pad 222a. The second bonding dielectric layer 230 includes bonding dielectric materials 230a and 230c and a second blocking layer 230b between the bonding dielectric materials 230a and 230c. The second bonding metal layer 232 includes a via plug 234 and a metal feature 236, wherein the via plug 234 is disposed between the metal feature 236 and the second pad 222b.

Referring to FIG. 1G, the second semiconductor structure 200 is further turned upside down and mounted onto the first semiconductor structure 100. That is, the first die 101 and the second die 201 are face-to-face bonded together via the first bonding structure 135 and the second bonding structure 235 to form the 3DIC structure 10 (or referred as a die stack structure 10). However, the embodiments of the present disclosure are not limited thereto. In other embodiments, the first die 101 and the second die 201 may be face-to-back bonded together.

In some embodiments, before the first die 101 is bonded to the second die 201, the first bonding structure 135 and the second bonding structure 235 are aligned, so that the first dummy metal feature 138 may be bonded to the second dummy metal feature 238, the first bonding metal layer 132 may be bonded to the second bonding metal layer 232, and the first bonding dielectric layer 130 may be bonded to the second bonding dielectric layer 230. In some embodiments, the alignment of the first bonding structure 135 and the second bonding structure 235 may be achieved by using an optical sensing method. After the alignment is achieved, the first bonding structure 135 and the second bonding structure 235 are bonded together by a hybrid bonding to form a hybrid bonding structure 35.

The first bonding structure 135 and the second bonding structure 235 are hybrid bonded together by the application of pressure and heat. It is noted that the hybrid bonding involves at least two types of bonding, including metal-to-metal bonding and non-metal-to-non-metal bonding such as dielectric-to-dielectric bonding or fusion bonding. As shown in FIG. 1G, the hybrid bonding structure 35 includes the first dummy metal feature 138 and the second dummy metal feature 238 bonded by metal-to-metal bonding, the first bonding metal layer 132 and the second bonding metal layer 232 bonded by metal-to-metal bonding, and the first bonding dielectric layer 130 and the second bonding dielectric layer 230 bonded by non-metal-to-non-metal bonding. However, the embodiments of the present disclosure are not limited thereto. In other embodiments, the first bonding structure 135 and the second bonding structure 235 may be bonded together by other bonding, such as fusion bonding.

On the other hand, the hybrid bonding structure 35 include a first portion P1, a second portion P2, and a third portion P3. As shown in FIG. 1G, the first portion P1 includes the first bonding metal layer 132 and the second bonding metal layer 232 bonding together; the second portion P2 includes the first bonding dielectric layer 130 and the second bonding dielectric layer 230 bonding together; and the third portion P3 includes the first dummy metal feature 138 and the second dummy metal feature 238 bonding together.

Figure 3A:
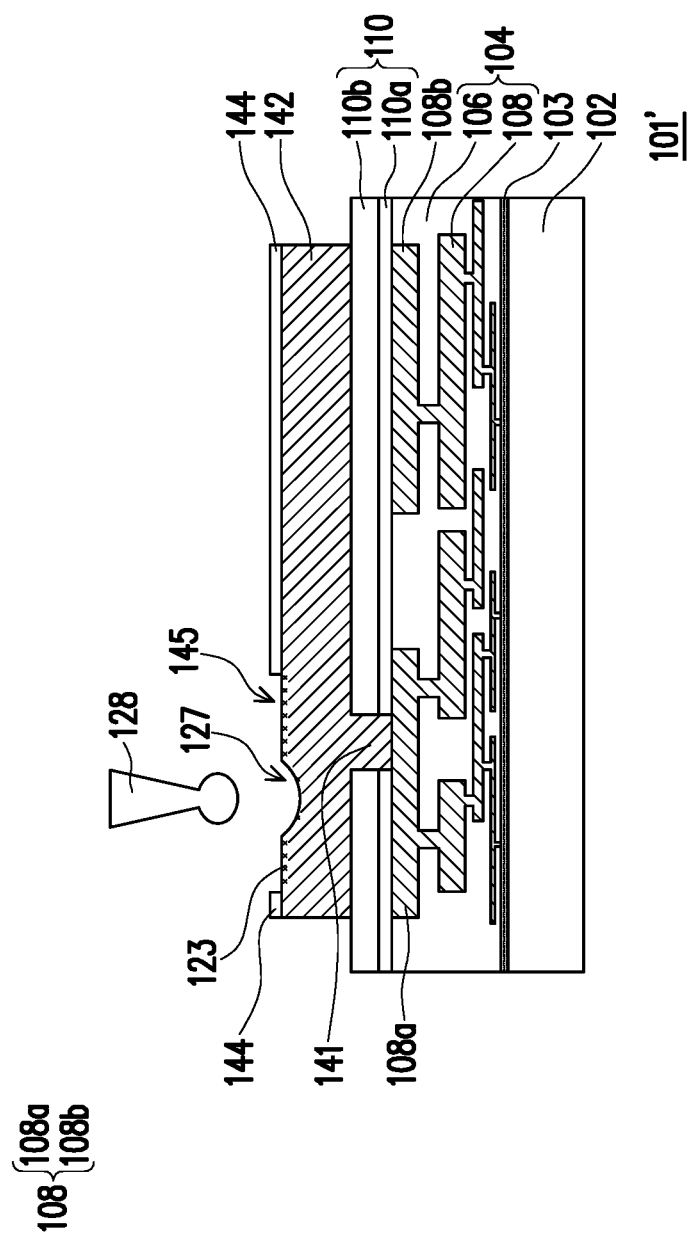
FIG. 3A to FIG. 3C are cross-sectional views of a method of forming a 3DIC structure in accordance with a second embodiment.
Figure 3B:
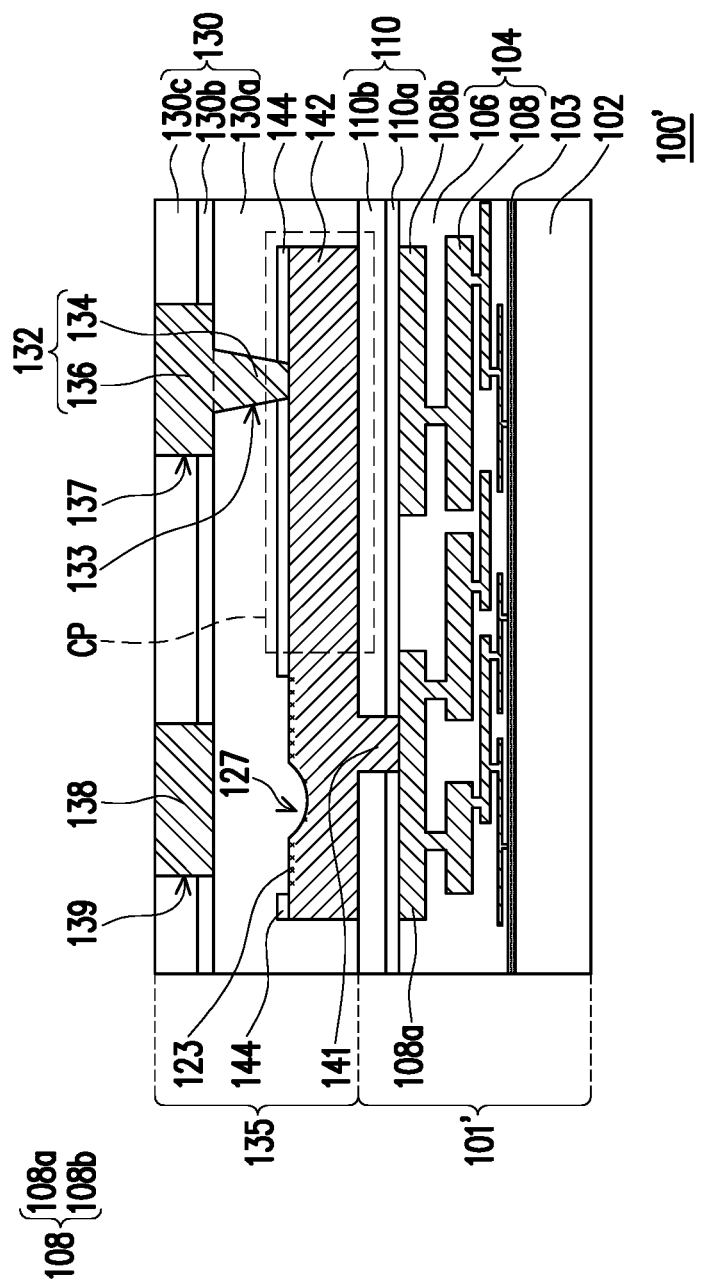
Figure 3C:
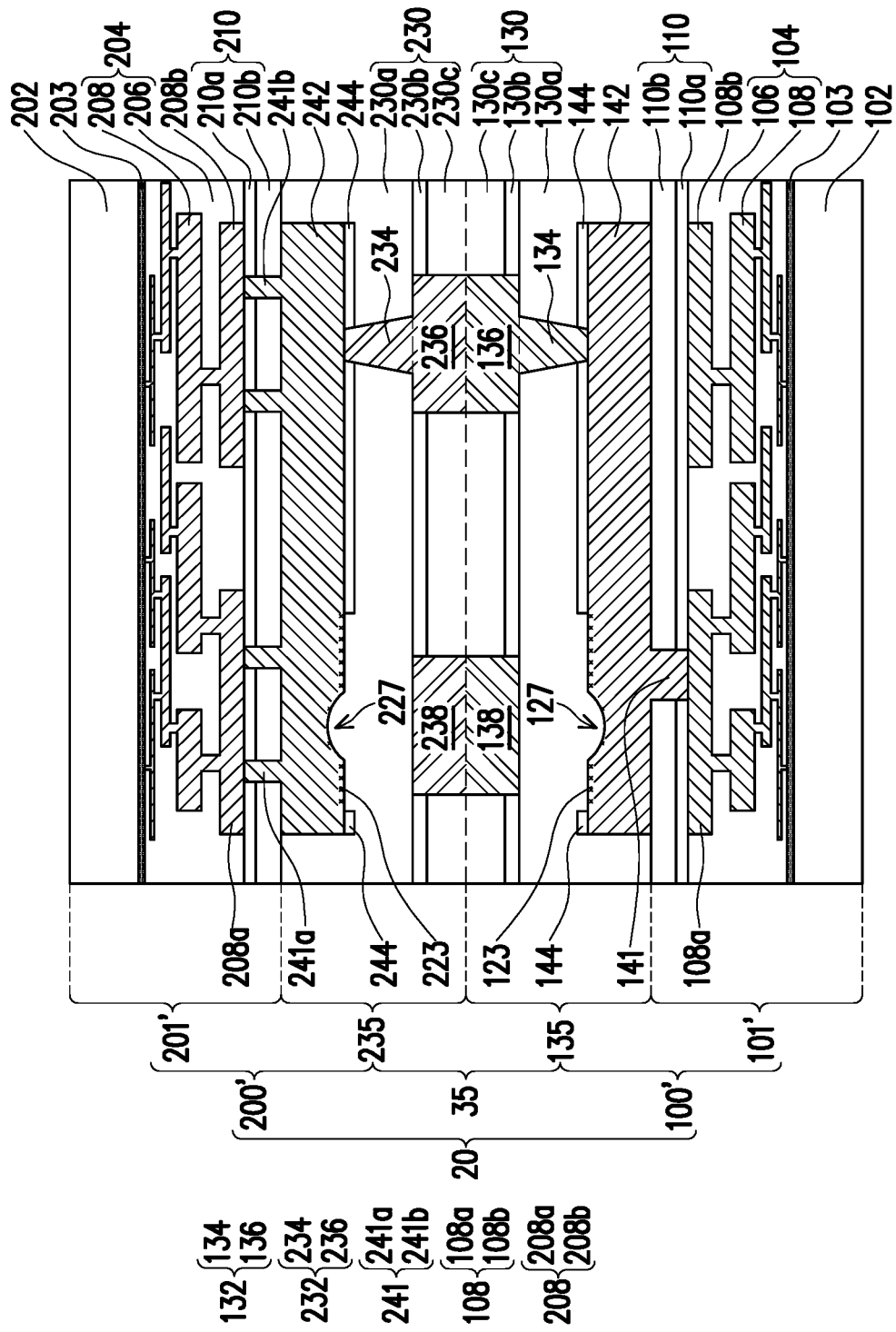
Figure 4:
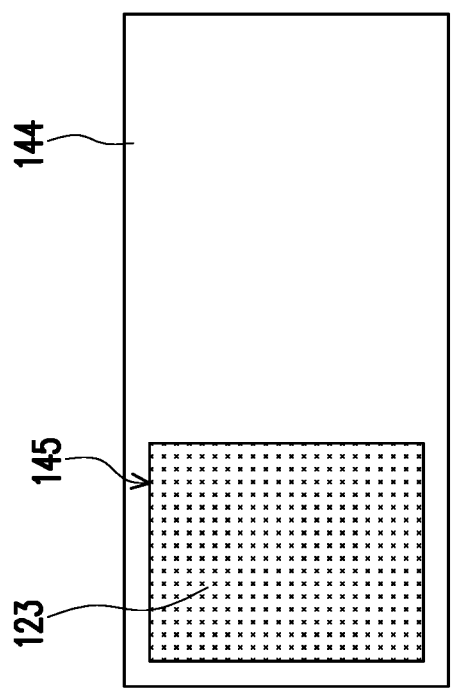
FIG. 4 is a top view showing a structure of FIG. 3A.

FIG. 3A to FIG. 3C are cross-sectional views of a method of forming a 3DIC structure in accordance with a second embodiment. FIG. 4 is a top view showing a structure of FIG. 3A.

Referring to FIG. 3A, a structure 101' is followed by the structure illustrated in FIG. 1A. After the structure illustrated in FIG. 1A is formed, the conductive material 112 and the cap material 114 are patterned to form a pad 142 and a cap layer 144 over the pad 142. As shown in FIG. 3A and the top view of FIG. 4, the pad 142 may be configured as a block structure extending along a direction from the top metal feature 108*a* to the top metal feature 108*b*. From another perspective, in some embodiments, the pad 142 is referred to as the first pad 122*a* and the second pad 122*b* illustrated in FIG. 1C connected to each other. The cap layer 144 is then patterned to form an opening 145 exposing a portion of the pad 142. After the cap layer 144 is patterned, residues 123 are formed in the portion of the pad 142 exposed by the opening 145. Thereafter, a circuit probing (CP) test is performed on the portion of the pad 142 exposed by the opening 145, thereby forming a probe mark 127 concaving or recessing into a top surface of the pad 142. In the case, in some embodiments, the portion of the pad 142 exposed by the opening 145 is referred to as a test pad.

Referring to FIG. 3A and FIG. 3B, a first bonding structure 135 is formed over the first die 101' to form a semiconductor structure 100'. The arrangement, material and forming method of the first bonding structure 135 are illustrated in above embodiments. Thus, details thereof are omitted here. A shown in FIG. 3B, the first dummy metal feature 138 corresponds to the top metal feature 108*a* and the probe mark 127, while the first bonding metal layer 132 corresponds to the top metal feature 108*b*. The first dummy metal feature 138 is electrically isolated from the pad 142 by the bonding dielectric material 130*a*. The first bonding metal layer 132 penetrates the first bonding dielectric layer 130 and the cap layer 144 to electrically connected to the pad 142. In the case, another portion of the pad 144 outside of the probe mark 127 is referred to as a connect pad CP which transfers the signal from the first die 101' to an overlying second die 201' (as shown in FIG. 3C). It should be noted that, in some embodiments, the cap layer 144 is able to protect the connect pad CP from forming the residues during the foregoing patterning process, thereby maintain the contact resistance between the connect pad CP and the first bonding metal layer 132. As such, the contact resistances between the connect pad CP and the first bonding metal layers 132 distributed in the entire first semiconductor structure 100' (or the entire semiconductor wafer) have a better uniformity, thereby enhancing the yield of the first semiconductor structure 100'.

Referring to FIG. 3C, a second semiconductor structure 200' is provided. In detail, the second semiconductor structure 200' includes a second die 201' and a second bonding structure 235 disposed over the second die 201'. In some embodiments, the arrangement, material and forming method of the second semiconductor structure 200' are similar to the arrangement, material and forming method of the first semiconductor structure 100'. Thus, details thereof are omitted here. A difference therebetween lies in that the pad 142 is electrically connected to the first interconnect structure 104 by a plug 141, while the pad 242 is electrically connected to the second interconnect structure 204 by a plurality of plugs 241 which includes first plugs 241*a* and second plugs 241*b*. In some embodiments, the number of the plugs between the pad and the interconnect structure may be adjusted by the need.

Referring to FIG. 3C, the second semiconductor structure 200' is further turned upside down and mounted onto the first semiconductor structure 100'. That is, the first die 101' and the second die 201' are face-to-face bonded together via the first bonding structure 135 and the second bonding structure 235 (i.e., the hybrid bonding structure 35) to form the 3DIC structure 20 (or referred as a die stack structure 20). However, the embodiments of the present disclosure are not limited thereto. In other embodiments, the first die 101' and the second die 201' may be face-to-back bonded together.

Figure 3D:
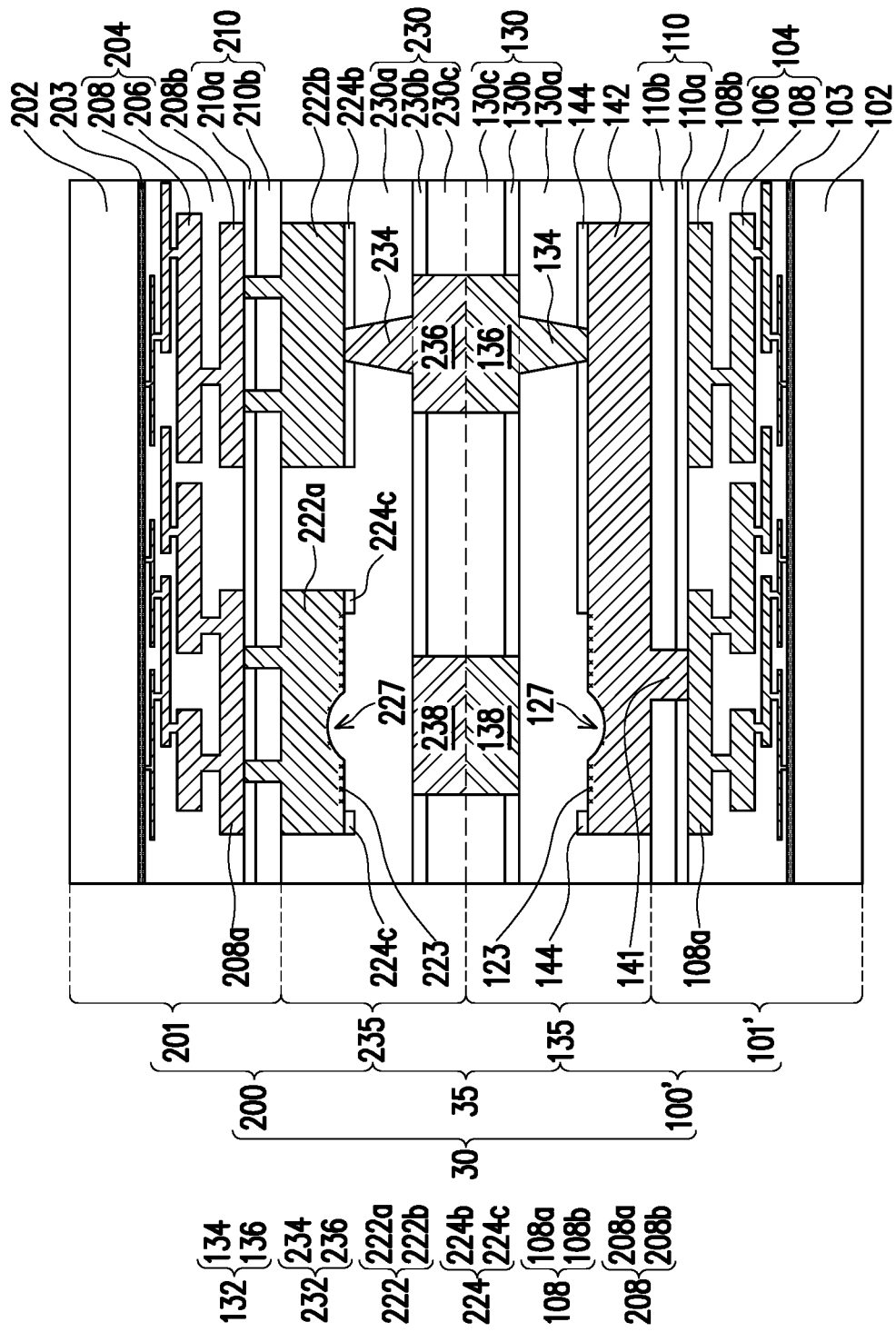
FIG. 3D is cross-sectional view of a 3DIC structure in accordance with a third embodiment.

FIG. 3D is cross-sectional view of a 3DIC structure in accordance with a third embodiment.

Referring to FIG. 3D, the second semiconductor structure 200 is further turned upside down and mounted onto the first semiconductor structure 100'. That is, the first die 101' and the second die 201 are face-to-face bonded together via the first bonding structure 135 and the second bonding structure 235 to form the 3DIC structure 30 (or referred as a die stack structure 30). That is, any two of the semiconductor structures 100, 100', 200, and 200' may be bonded together by the hybrid bonding structure 35, so as to form the 3DIC structure.

Figure 5A:
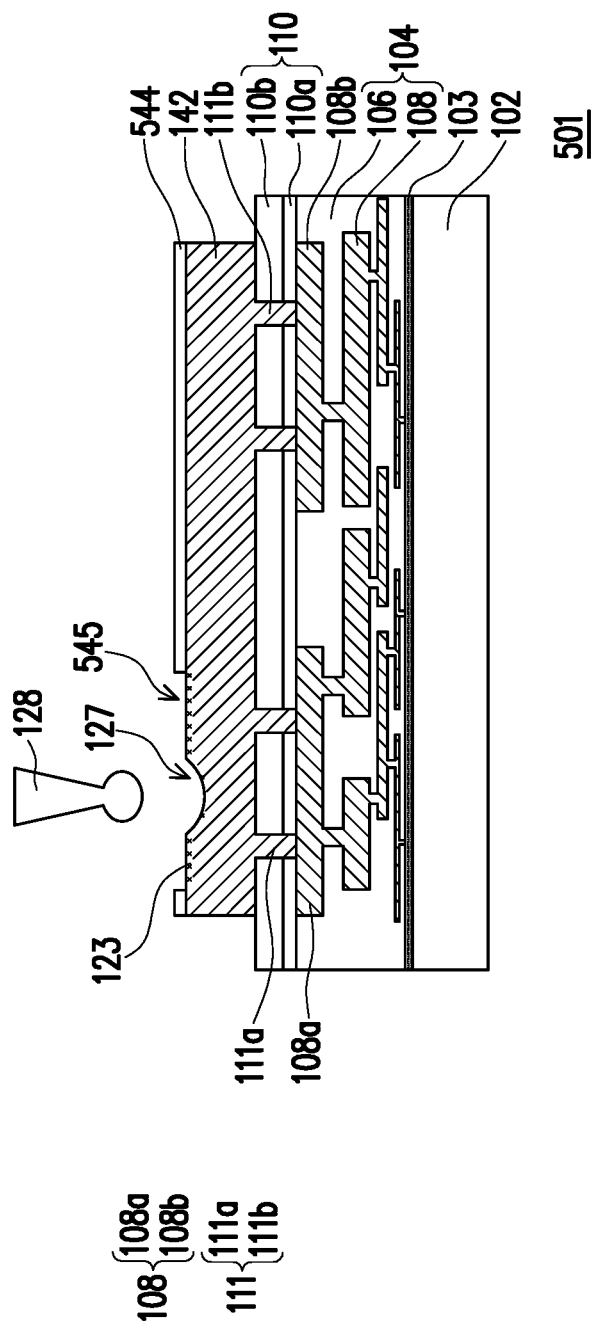
FIG. 5A to FIG. 5B are cross-sectional views of a method of forming a semiconductor structure in accordance with a fourth embodiment.
Figure 5B:
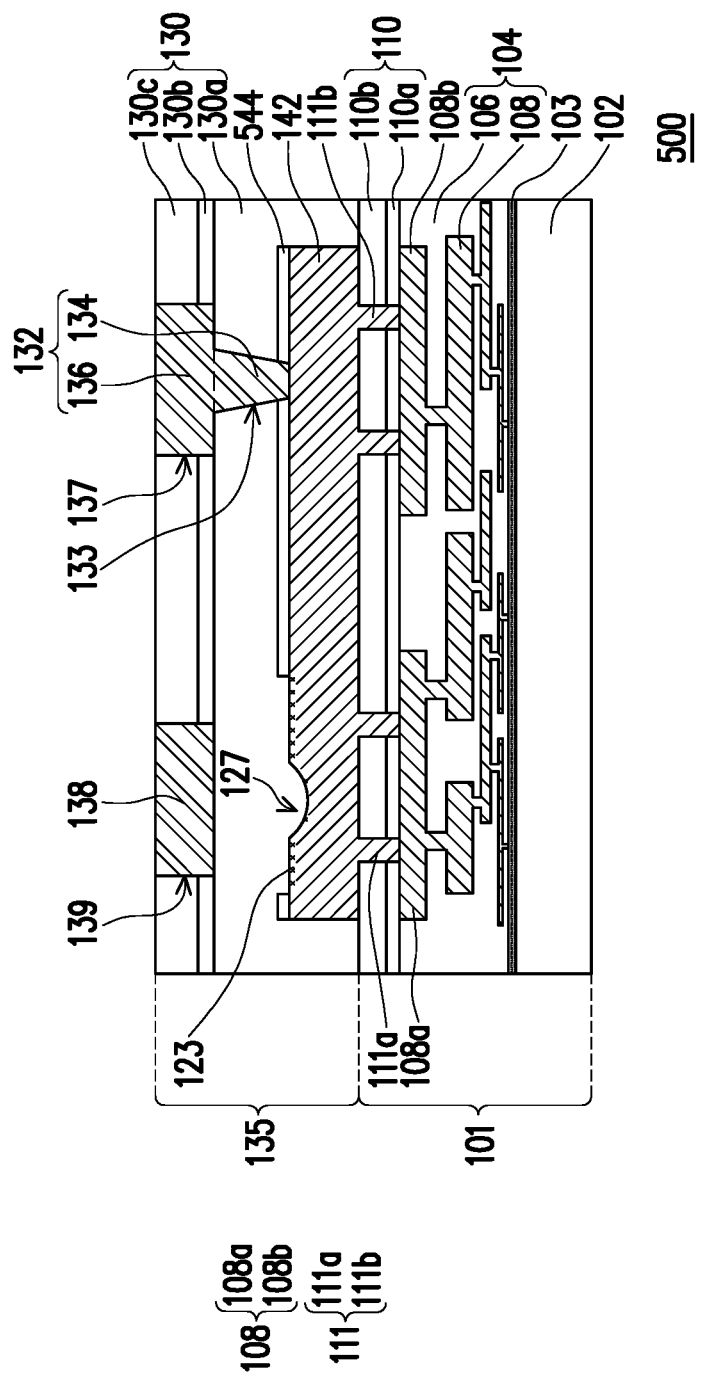
Figure 6:
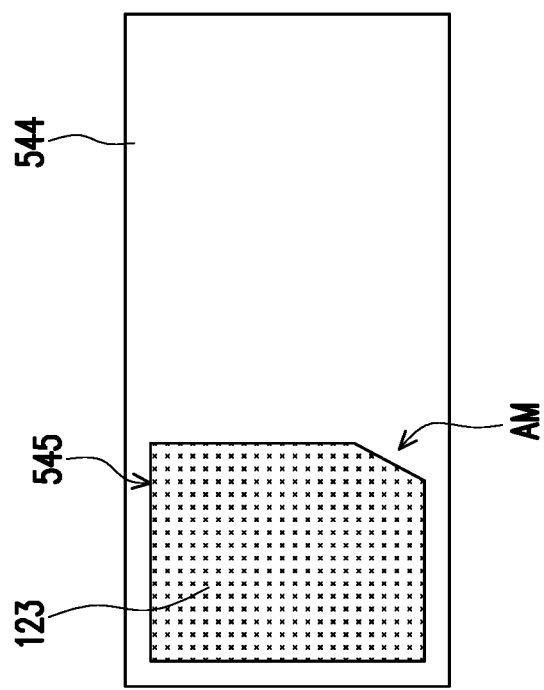
FIG. 6 is a top view showing a structure of FIG. 5A.

FIG. 5A to FIG. 5B are cross-sectional views of a method of forming a semiconductor structure in accordance with a fourth embodiment. FIG. 6 is a top view showing a structure of FIG. 5A.

Referring to FIG. 5A, a structure 501 is followed by the structure illustrated in FIG. 1A. After the structure illustrated in FIG. 1A is formed, the conductive material 112 and the cap material 114 are patterned to form a pad 142 and a cap layer 544 over the pad 142. As shown in FIG. 5A and the top view of FIG. 6, the pad 142 may be configured as a block structure extending along a direction from the top metal feature 108a to the top metal feature 108b. The cap layer 144 is then patterned to form an opening 545 exposing a portion of the pad 142. It should be noted that, as shown in FIG. 6, the opening 545 has an alignment mark AM, so that a top view shape of the portion of the top surface of the pad 142 exposed by the opening 545 is polygonal. In some embodiments, the alignment mark AM may be disposed at any side or corner of the opening 545 to provide an orientation for the probe 128 alignment. After the cap layer 544 is patterned, residues 123 are formed in the portion of the pad 142 exposed by the opening 545. Thereafter, a circuit probing (CP) test is performed on the portion of the pad 142 exposed by the opening 545, thereby forming a probe mark 127 concaving or recessing into a top surface of the pad 142. In the case, in some embodiments, the portion of the pad 142 exposed by the opening 545 is referred to as a test pad.

Referring to FIG. 5A and FIG. 5B, a first bonding structure 135 is formed over the first die 501 to form a semiconductor structure 500. The arrangement, material and forming method of the first bonding structure 135 are illustrated in above embodiments. Thus, details thereof are omitted here. Thereafter, the semiconductor structure 500 may be bonded to any one of the semiconductor structures 100, 100', 200, and 200' by the hybrid bonding structure 35, so as to form a new 3DIC structure.

According to some embodiments, a semiconductor structure includes a substrate, an interconnect structure, a conductive pad, a dielectric cap, and a bonding structure. The interconnect structure is disposed over the substrate. The conductive pad is disposed over and electrically connected to the interconnect structure. The dielectric cap is disposed over the conductive pad and exposes a portion of a top surface of the conductive pad. The portion of the top surface of the conductive pad has a probe mark. The bonding structure is disposed over the dielectric cap. The bonding structure includes a bonding metal layer penetrating the dielectric cap to electrically connected to the conductive pad.

According to some embodiments, a three dimensional integrated circuit (3DIC) structure includes a first die and a second die bonded together. One of the first die and the second die has a conductive pad and a dielectric cap disposed over the conductive pad. The dielectric cap exposes a portion of a top surface of the conductive pad having a probe mark.

According to some embodiments, a method of fabricating a semiconductor structure includes the following steps. An interconnect structure is formed over a substrate. A conductive pad is formed over the interconnect structure and a dielectric cap is formed over the conductive pad. The dielectric cap is patterned to expose a portion of a top surface of the conductive pad. A circuit probing (CP) test is performed, so that the portion of the top surface of the conductive pad has a probe mark. A bonding structure is formed over the dielectric cap. The bonding structure includes a bonding metal layer penetrating the dielectric cap to electrically connected to the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an interconnect structure, disposed over a substrate;
   a conductive pad, disposed over and electrically connected to the interconnect structure;
   a dielectric cap, disposed over the conductive pad and exposing a portion of a top surface of the conductive pad, wherein the portion of the top surface of the conductive pad has a probe mark; and
   a bonding structure, disposed over the dielectric cap, wherein the bonding structure comprises a bonding metal layer penetrating the dielectric cap to electrically connected to the conductive pad, and the bonding metal layer comprises:
   a metal feature disposed over the conductive pad; and
   a via plug disposed between the metal feature and the conductive pad, wherein the via plug penetrates the dielectric cap to be in contact with the conductive pad.

2. The semiconductor structure of claim 1, wherein the probe mark is recessed into the portion of the top surface of the conductive pad.

3. The semiconductor structure of claim 1, wherein the portion of the top surface of the conductive pad exposed by the dielectric cap has an alignment mark therein.

4. The semiconductor structure of claim 1, wherein the conductive pad comprises a first pad and a second pad separating from each other, the dielectric cap comprises a first cap layer and a second cap layer separating from each other, the first cap layer exposes a portion of a top surface of the first pad and the probe mark, and the second cap layer covers a top surface of the second pad.

5. The semiconductor structure of claim 4, wherein the first pad is electrically isolated from the bonding metal layer.

6. The semiconductor structure of claim 4, wherein the second pad is electrically connected to the bonding metal layer.

7. The semiconductor structure of claim 1, wherein the bonding structure further comprises a bonding dielectric layer, the bonding dielectric layer comprises:
   a first bonding dielectric material covering the conductive pad;
   a second bonding dielectric material disposed over the first bonding dielectric material; and
   a blocking layer disposed between the first bonding dielectric material and the second bonding dielectric materials.

8. The semiconductor structure of claim 7,
   wherein the blocking layer and the first bonding dielectric material and/or the second bonding dielectric material have different materials.

9. The semiconductor structure of claim 1, further comprising:
a dummy metal feature disposed in the second bonding dielectric material and exposed by the second bonding dielectric material.

10. The semiconductor structure of claim 1, wherein the conductive pad is a test pad, and the semiconductor structure comprises a known good die (KGD).

11. A three dimensional integrated circuit (3DIC) structure, comprising:
a first die and a second die bonded together, wherein one of the first die and the second die has a conductive pad and a dielectric cap disposed over the conductive pad, the dielectric cap exposes a portion of a top surface of the conductive pad, and the portion of the top surface of the conductive pad has a probe mark, wherein the first die and the second die are bonded together by a hybrid bonding structure, the hybrid bonding structure comprises:
a first portion, comprising a first bonding metal layer and a second bonding metal layer bonding together; and
a second portion, comprising a first bonding dielectric layer and a second bonding dielectric layer bonding together, wherein the first bonding metal layer is disposed in the first bonding dielectric layer and the second bonding metal layer is disposed in the second bonding dielectric layer.

12. The 3DIC structure of claim 11, wherein the first bonding metal layer or the second bonding metal layer penetrates the dielectric cap to electrically connect to the conductive pad.

13. The 3DIC structure of claim 11, wherein the conductive pad comprises a first pad and a second pad separating from each other, the dielectric cap comprises a first cap layer on the first pad and a second cap layer on the second pad separating from each other, the first cap layer exposes a portion of a top surface of the first pad and the probe mark, and the second cap layer covers a top surface of the second pad.

14. The 3DIC structure of claim 13, wherein the first pad is electrically isolated from the bonding metal layer.

15. The 3DIC structure of claim 13, wherein the second pad is electrically connected to the bonding metal layer.

16. A method of fabricating a semiconductor structure, comprising:
forming an interconnect structure over a substrate;
forming a conductive pad over the interconnect structure and a dielectric cap over the conductive pad;
patterning the dielectric cap to expose a portion of a top surface of the conductive pad;
performing a circuit probing (CP) test, and the portion of the top surface of the conductive pad has a probe mark; and
forming a bonding structure over the dielectric cap, wherein the bonding structure comprises a bonding metal layer penetrating the dielectric cap to electrically connected to the conductive pad, and the bonding metal layer comprises:
a metal feature disposed over the conductive pad; and
a via plug disposed between the metal feature and the conductive pad, wherein the via plug penetrates the dielectric cap to be in contact with the conductive pad.

17. The method of claim 16, wherein the forming the conductive pad and the dielectric cap comprises:
forming sequentially a conductive material and a cap material over the interconnect structure;
patterning the conductive material and the cap material to form a first pad and a second pad separating from each other and form a first cap layer and a second cap layer separating from each other, wherein the first cap layer is formed on the first pad and exposes a portion of a top surface of the first pad and the probe mark, and the second cap layer is formed on the second pad and covers a top surface of the second pad, after patterning the dielectric cap.

18. The method of claim 17, wherein the first pad is formed to electrically isolated from the bonding metal layer, and the second pad is formed to electrically connected to the bonding metal layer.

19. The method of claim 16, wherein the conductive pad is formed to comprise a first pad and a second pad separating from each other, the dielectric cap is formed to comprise a first cap layer and a second cap layer separating from each other, the first cap layer exposes a portion of a top surface of the first pad and the probe mark, and the second cap layer covers a top surface of the second pad.

20. The method of claim 19, wherein the first pad is electrically isolated from the bonding metal layer.

* * * * *